(12) United States Patent
Conklin et al.

(10) Patent No.: US 10,856,045 B2
(45) Date of Patent: Dec. 1, 2020

(54) HANDLING EXCEPTIONS REPORTED BY MEDIA DEVICE METERS

(71) Applicant: The Nielsen Company (US), LLC, New York, NY (US)

(72) Inventors: Charles Clinton Conklin, New Port Richey, FL (US); Michael Lombardi, Oldsmar, FL (US)

(73) Assignee: The Nielsen Company (US), LLC, New York, NY (US)

( * ) Notice: Subject to any disclaimer, the term of this patent is extended or adjusted under 35 U.S.C. 154(b) by 0 days.

(21) Appl. No.: 16/121,898

(22) Filed: Sep. 5, 2018

(65) Prior Publication Data

US 2020/0077146 A1 Mar. 5, 2020

(51) Int. Cl.
| | | |
|---|---|---|
| *H04N 21/439* | (2011.01) | |
| *H04N 21/442* | (2011.01) | |
| *H04L 29/08* | (2006.01) | |
| *H04H 60/32* | (2008.01) | |
| *G01R 35/00* | (2006.01) | |

(52) U.S. Cl.
CPC ....... *H04N 21/44222* (2013.01); *H04L 67/22* (2013.01); *H04N 21/4394* (2013.01); *H04N 21/44218* (2013.01); *G01R 35/005* (2013.01); *G09G 2330/021* (2013.01); *H04H 60/32* (2013.01); *H04N 21/4396* (2013.01)

(58) Field of Classification Search
CPC ......... H04N 21/44222; H04N 21/4394; H04N 21/4396; H04H 60/32; G09G 2330/021; G01R 35/005
See application file for complete search history.

(56) References Cited

U.S. PATENT DOCUMENTS

| | | |
|---|---|---|
| 5,692,093 A | 11/1997 | Iggulden et al. |
| 7,882,514 B2 | 2/2011 | Nielsen et al. |
| 8,674,556 B2 | 3/2014 | Tinaphong et al. |
| 2002/0141730 A1 | 10/2002 | Haken |
| 2005/0073518 A1 | 4/2005 | Bontempi |
| 2007/0192782 A1* | 8/2007 | Ramaswamy ......... H04H 60/37 725/9 |
| 2013/0215006 A1* | 8/2013 | Liss ....................... H04H 60/32 345/156 |
| 2013/0312019 A1* | 11/2013 | McMillan ........ H04N 21/42203 725/14 |
| 2016/0295279 A1* | 10/2016 | Srinivasan ....... H04N 21/44213 |

\* cited by examiner

*Primary Examiner* — Pinkal R Chokshi
(74) *Attorney, Agent, or Firm* — Hanley, Flight & Zimmerman, LLC (57) ABSTRACT

Apparatus, systems, articles of manufacture, and methods are disclosed for handling exceptions reported by media device meters. An example apparatus includes a static display detector to determine whether current measurements for a media presentation device at a time corresponding to an exception reported by a media device meter indicate the media presentation device was in a static display state at the time corresponding to the exception. The example apparatus includes a muted viewing detector to determine whether the media presentation device was in a muted viewing state at the time of the exception based on an audio level associated with the media presentation device, and an exception modifier to determine whether to modify the exception based on whether the media presentation device was in the static display state and whether the media presentation device was in a muted viewing state at the time of the exception.

14 Claims, 6 Drawing Sheets

HANDLING EXCEPTIONS REPORTED BY MEDIA DEVICE METERS

FIELD OF THE DISCLOSURE

This disclosure relates generally to media device meters, and, more particularly, to apparatus, systems, articles of manufacture, and methods for handling exceptions reported by media device meters.

BACKGROUND

Media device meters enable monitoring of media consumption. Media device meters can report exceptions to the monitoring of the media when the media device meters are unable to identify media. Causes of some exceptions include malfunctioning of the media device meter or a lack of perceptible media being presented around the media device meter.

BRIEF DESCRIPTION OF THE DRAWINGS

The figures are not to scale. In general, the same reference numbers will be used throughout the drawing(s) and accompanying written description to refer to the same or like parts.

DETAILED DESCRIPTION

Audience measurement entities (AMEs) desire knowledge on how users interact with media devices such as, for example, smartphones, tablets, laptops, televisions, smart televisions, radios, digital video recorders, digital media players, etc. In particular, AMEs want to monitor media presentations made at the media devices to, among other things, determine ownership and/or usage statistics of media devices, relative rankings of usage and/or ownership of media devices, types of uses of media devices (e.g., whether a device is used for browsing the Internet, streaming media from the Internet, etc.), other types of media device information, and/or other monitoring information including, for example, advertisements exposure, advertisement effectiveness, user behavior, purchasing behavior associated with various demographics, etc.

As used herein, the term "media" includes any type of content and/or advertisement delivered via any type of distribution medium. Thus, media includes television programming or advertisements, radio programming or advertisements, movies, web sites, streaming media, etc. In examples disclosed herein, monitoring information includes, but is not limited to, media identifying information (e.g., media-identifying metadata, codes, signatures, watermarks, and/or other information that may be used to identify presented media), application usage information (e.g., an identifier of an application, a time and/or duration of use of the application, a rating of the application, etc.), and/or user-identifying information (e.g., demographic information, a user identifier, a panelist identifier, a username, etc.).

In some examples, to effectively monitor media consumption, AMEs employ panelists. These panelists are provided with monitoring devices, monitoring software, surveys, and/or other mechanisms to gather media monitoring information. For example, the panelists can be provided with a media device meter that includes data collection components, such as a microphone, a wireless connection, input ports to connect to presentation devices, etc. Some media monitors are portable and can be carried around by the panelist (e.g., on their belt, in their pocket, etc.). Some media device meters are associated with specific media presentation devices (e.g., a television, a set top box, etc.) or specific locations (e.g., a living room, a kitchen, etc.). In some examples, the media device meter may require installation at a panelist's household. For example, the media device meter may be utilized to monitor usage of a television and consumption of media using the television. Such a media device meter can be installed by making video, audio, and/or other data connections between the media device meter and the television.

When a media device meter is installed at a panelist's household to enable monitoring of a media presentation device, the media device meter may initially encounter exceptions due to an improper configuration/installation. For example, a media device meter can encounter exceptions pertaining to unviewable conditions, sometimes referred to as excessive un-viewable (EUV) exceptions. If a media device meter encounters numerous times where the media presentation device is turned on (and monitoring is thus enabled on the media device meter) but the media presentation device does not appear to be presenting anything, the media device meter can record an unviewable condition. Numerous occurrences of an unviewable condition within a short time period can result in an excessive un-viewable (EUV) exception. A media device meter can also encounter exceptions indicating "other" tuning, indicating that the media presentation device that is being monitored is powered on, but tuning data is not recognized. These types of exceptions are sometimes referred to as "All-Other Tuning" exceptions. When a media device meter encounters an exception, the media device meter transmits the exception (along with other meter data) to the AME.

When a newly-installed media device meter is transmitting numerous exceptions to the AME, the AME may determine whether or not to send a technician to the panelist's household to troubleshoot the exceptions being issued by the media device meter. In some examples, the media device meter is not actually misconfigured or improperly installed (e.g., resulting in incorrect exceptions), but rather is reporting exceptions that are correct. The correct exceptions are caused by the media presentation device (which the media device meter is monitoring) being powered on, but operating in a muted viewing state and/or a static display state (e.g., a television is turned on, but a set top box connected to the television is turned off). In these examples, the technician is unnecessarily sent to the household to troubleshoot the media device meter when the media device meter is actually functioning properly and there is no configuration or installation issue.

Example apparatus, systems, articles of manufacture (e.g., physical storage media), and methods for handling exceptions reported by media device meters are disclosed herein. Some example exception handling techniques disclosed herein include determining whether a media presentation device being monitored by the media device meter was in a static display state at a time of the exception. In some examples, current measurements associated with the media presentation device at the time of the exception are analyzed to determine (1) whether the current draw at the time of the exception falls within a threshold range and/or (2) whether the current draw was constant within a threshold deviation for a duration threshold. As used herein, the term "current," refers to electrical current (e.g., AC current, DC current, etc.). In some examples, in response to determining that the media device was not displaying a static display at the time of the exception, audio measurements can be utilized to determine whether the media presentation device was instead in a muted viewing state (e.g., corresponding to the television presenting video content but no audio being presented) based on an audio level at the time of the exception.

Example apparatus, systems, and articles of manufacture (e.g., physical storage media), and methods disclosed herein enable modification of exceptions by flagging of metering exceptions as correct and/or incorrect based on whether the media presentation device was in the static display state, the muted viewing state, or neither of these states. For example, if it is determined that the media presentation device was in the static display state at the time of the exception, the exception can be flagged as "correct," indicating that the meter is working properly and encountered an exception due to the media presentation device not presenting perceptible media. Similarly, if it is determined that the media presentation device was in the muted viewing state, the exception can be flagged as "correct." In some examples, in response to determining that the media presentation device that is being monitored by the media device meter is neither in the static display state nor the muted viewing state, the meter exception is flagged as being incorrect. An incorrect meter exception indicates that the exception did not occur due to the state of an audio or video presentation on the media device. The incorrect meter exception could be indicative of a configuration and/or installation issue with the media device meter. Thus, a media device meter correctly reports an exception when the media device meter reports that media is not being presented because the media presentation device is in a static display state or a muted state. It is expected to have a correct exception reported. Whereas, the media meter device incorrectly reports an exception when there is no evidence that the media presentation device was in the static display state or muted state. In this example, it is unexpected to have an exception reported and, therefore, the exception is an incorrect exception.

In determining whether the exception is correct or incorrect based on audio data, current data, and/or other data associated with the media presentation device, the AME can remotely identify whether a meter is reporting exceptions due to a lack of perceptible media (a correct exception) or due to a possible issue with the media device meter (an incorrect exception). The examples disclosed herein can therefore significantly reduce the costs, time, and resources spent sending technicians to troubleshoot media device meters at households by identifying exceptions that are correct, and not indicative of technical problems with the media device meter. Further, these examples can be used to process media device meter exceptions at the AME and, therefore, flag exceptions as corresponding to media presentation devices in a static display state, media presentation devices in a muted viewing state, or neither of these states. This improvement in the granularity of the exception data can help AMEs analyze patterns in exceptions that are reported and more accurately troubleshoot actual media device meter problems.

Figure 1:
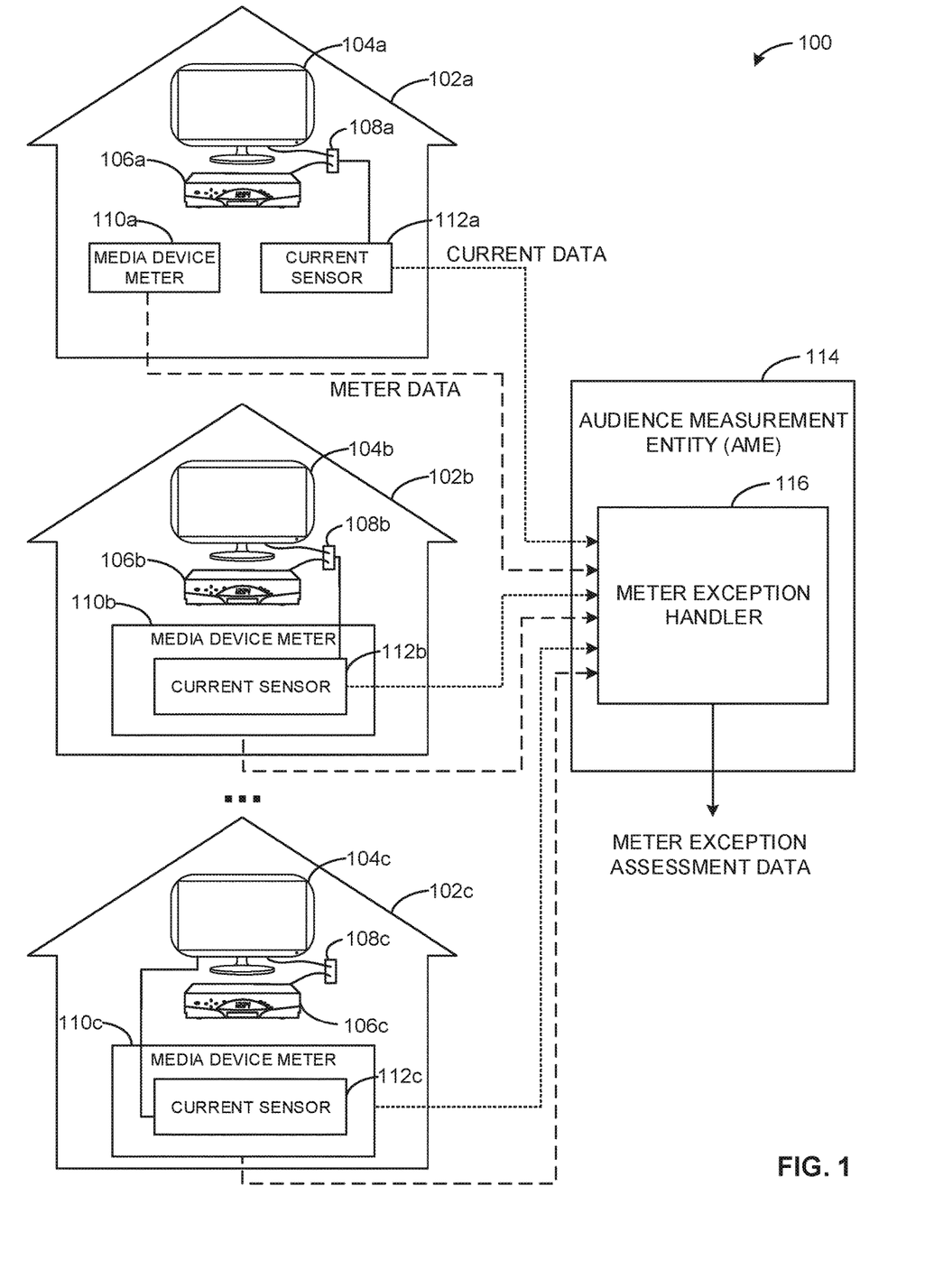
FIG. 1 is an example environment and system for handling exceptions reported by media devices meters that includes an example meter exception handler in accordance with the teachings of this disclosure.

FIG. 1 is an example environment 100 for handling exceptions reported by media devices meters in accordance with the teachings of this disclosure. The example environment 100 represents portions of an example media monitoring system. The example environment 100 includes an example first household 102a, an example second household 102b, an example third household 102c, an example first media presentation device 104a, an example second media presentation device 104b, an example third media presentation device 104c, an example first set top box 106a, an example second set top box 106b, an example third set top box 106c, an example first outlet 108a, an example second outlet 108b, an example third outlet 108c, an example first media device meter 110a, an example second media device meter 110b, an example third media device meter 100c, an example first current sensor 112a, an example second current sensor 112b, an example third current sensor 112c, an example audience measurement entity (AME) 114, and an example meter exception handler 116.

The example first, second, and third households 102a, 102b, 102c of the illustrated example of FIG. 1 are locations where media monitoring is performed. For example, the first, second, and third households 102a, 102b, 102c can be panelist households. The example AME 114 can receive data from any number of households. The first, second, and third households 102a, 102b, 102c represent three possible metering configurations to monitor the respective first, second, and third media presentation devices 104a, 104b, 104c within the households.

The example first, second, and third media presentation devices 104a, 104b, 104c of the illustrated example of FIG. 1 present media within the respective first, second, and third households 102a, 102b, 102c. In the illustrated example of FIG. 1, the first, second, and third media presentation devices 104a, 104b, 104c are televisions. However, the first, second, and third media presentation devices 104a, 104b, 104c could be any devices that present media. In some examples, the first, second, and third media presentation devices 104a, 104b, 104c are capable of directly presenting media (e.g., via a display), while in some examples, the first, second, and third media presentation devices 130 present the media on separate equipment (e.g., via separate speakers, via a video display, etc.). Any types or numbers of media presentation device(s) may be present in the first, second, and third households 102a, 102b, 102c, and any combination of the media presentation device(s) in the first, second, and third households 102a, 102b, 102c can be monitored. For example, the media presentation devices 104a, 104b, 104c can be laptops, desktop computers, video game counsels, tablet devices, digital media players, smart televisions, servers, etc.

The example first, second, and third set top boxes 106a, 106b, 106c of the illustrated example of FIG. 1 provide media for presentation on the first, second, and third media presentation devices 104a, 104b, 104c. For example, the first, second, and third set top boxes 106a, 106b, 106c can receive cable television signals and transmit the cable television signals to the first, second, and third media presentation devices 104a, 104b, 104c. In some examples, the first, second, and third media presentation devices 104a, 104b, 104 can be turned on, but will not display media unless the respective first, second, and third set top boxes 106a, 106b, 106c are turned on and tuned to a channel. In some examples, the first, second, and third media presentation devices 104a, 104b, 104c may not require the respective first, second, and third set top boxes 106a, 106b, 106c, and may additionally or alternatively receive media directly at the presentation device (e.g., via a cable connection directly to the media presentation device, via a wireless signal, via an accessory attached to the media presentation device, via removable media such as a digital video disc, etc.).

The example first, second, and third outlets 108a, 108b, 108c of the illustrated example of FIG. 1 serve as connections to power sources to provide power for the first, second, and third media presentation devices 104a, 104b, 104c and/or the first, second, and third set top boxes 106a, 106b, 106c. In some examples, the first, second, and third outlets 108a, 108b, 108c can be any type and/or number of outlets. For example, the first outlet 108a can actually be two separate outlets, wherein the first media presentation device 104a is plugged into (e.g., connected to) a first of the two separate outlets, and the first set top box 106a is plugged into the second of the two separate outlets. In the illustrated example of FIG. 1, the first and second current sensors 112a, 112b are also connected to the respective first and second outlets 108a, 108b to enable current measurements associated with the respective first and second media presentation devices 104a, 104b.

The example first, second, and third media device meters 110a, 110b, 110c of the illustrated example of FIG. 1 collect data pertaining to media consumption in the respective first, second, and third households 102a, 102b, 102c. In some examples, the first, second, and third media device meters 110a, 110b, 110c include microphones, direct connections (e.g., data connections) to the respective first, second, and third media presentation devices 104a, 104b, 104c, wireless connections to the respective first, second, and third media presentation devices 104a, 104b, 104c, cameras, and/or any other components to enable media monitoring. The example first, second, and third media device meters 110a, 110b, 110c transmit meter data to the AME 114, where the meter data can be processed by the meter exception handler 116. In some examples, the first, second, and third media device meters 110a, 110b, 110c are connected to the first, second, and third media presentation devices 104a, 104b, 104c and/or to the first, second, and third set top boxes 106a, 106b, 106c. In the example second and third households 102b, 102c the example second and third media device meters 110b, 110c include the example second and third current sensors 112b, 112c. For example, the example second and third current sensors 112b, 112c may be housed within or otherwise integral with the example second the third media device meters 110b, 100c, respectively.

The example first, second, and third current sensors 112a, 112b, 112c of the illustrated example of FIG. 1 determine current measurements associated with the respective first, second, and third media presentation devices 104a, 104b, 104c. The first current sensor 112a of the first household 102a is separate from the first media device meter 110a and is connected to the first outlet 108a. In some examples, the first current sensor 112a is an attachment to the first outlet that measures the current associated with any other device connected to the first outlet 108a. The example second current sensor 112b is connected to the second outlet 108b, but, unlike the first current sensor 112a, the second current sensor 112b is part of (e.g., included within) the second media meter device 110b. In such an example, the second media meter device 110b can be connected to the second outlet 108b, to enable the second current sensor 112b to collect current measurements associated with the second media presentation device 104b. The example third current sensor 112c is part of the third media meter device 110c. However, instead of being connected directly to the third outlet 108c, the third current sensor 112c is connected to the third media presentation device 104c. In this configuration, the third current sensor 112c is connected to circuitry of the third media presentation device 104c to determine current measurements of the third media presentation device 104c. While the example configurations of the first, second, and third current sensors 112a, 112b, 112c represent three possible configurations to collect current measurements from respective first, second, and third media presentation devices 104a, 104b, 104c, the first, second, and third current sensors 112a, 112b, 112c could be any devices and/or software to determine current measurements of media presentation devices. In some examples, the first, second, and third current sensors 112a, 112b, 112c transmit current data to the AME 114. In some examples, the first, second, and third current sensors 112a, 112b, 112c transmit current data to the meter exception handler 116.

The example AME 114 of the illustrated example of FIG. 1 is an entity responsible for collecting media monitoring information. The example AME 114 collects current data and meter data from the first, second, and third households 102a, 102b, 102c. In some examples, the AME 114 is associated with one or more locations (e.g., a central facility) where data is aggregated and/or analyzed. The example AME 114 includes the meter exception handler 116 to assess meter exceptions and determine whether the meter exceptions are correct or incorrect. In response to the meter exception handler 116 determining that one or more meter exceptions issued by one of the first, second, and/or third media device meters 110a, 110b, 110c are incorrect (e.g., due to possible malfunction of the respective media device meter), the AME 114 can perform troubleshooting tasks to correct problems associated with the respective meter(s) (e.g., perform remote troubleshooting, send a technician to the household, etc.).

The example meter exception handler 116 of the illustrated example of FIG. 1 analyzes exceptions from the first, second, and third media device meters 110a, 110b, 110c. In some examples, the meter exception handler 116 accesses meter data, including meter exceptions and audio data, from one or more of the first, second, and/or third media device meters 110a, 110b, 110c, as well as current data from one or more of the first, second, and/or third current sensors 112a, 112b, 112c. In some examples, when a meter exception is accessed by the meter exception handler 116, the meter exception handler 116 accesses current data and audio data for the media presentation device 104a, 104b, 104c associated with the exception. In such examples, the current data and audio data corresponding to the time of the exception is analyzed.

The meter exception handler 116 can determine whether the media presentation device 104a, 104b, 104c to which the meter data and current data corresponds was in a static display state at the time of the exception, or whether the media presentation device 104a, 104b, 104c was in a muted viewing state at the time of the exception. In some examples, to determine whether the media presentation device 104a, 104b, 104c was in the static display state, the meter exception handler 116 determines whether the current data falls within a threshold range at the time of the exception, and/or whether the current remained constant within a deviation threshold for a duration threshold. In some examples, to determine whether the media presentation device 104a, 104b, 104c was in a muted viewing state at the time of the exception, the meter exception handler 116 additionally or alternatively determines whether an audio level at the time of the exception was below a volume threshold.

In response to determining that the media presentation device 104a, 104b, 104c was in either the static display state or the muted viewing state at the time of an exception, the meter exception handler 116 flags the exception as correct (e.g., because the media device meter 110a, 110b, 110c is operating correctly in reporting an exception, as there is no perceptible media being presented). Conversely, in response to determining that the media presentation device 104a, 104b, 104c was not in the static display state nor the muted viewing state at the time of the exception, the meter exception handler 116 flags the exception as incorrect. In some examples, the meter exception handler 116 reports meter exceptions that are incorrect to the AME 114 to enable the AME 114 to initiate corrective action on the media device meter 110a, 110b, 110c associated with the incorrect meter exception.

In operation, the first, second, and third households 102a, 102b, 102c include respective first, second, and third media presentation devices 104a, 104b, 104c that access media using respective first, second, and third set top boxes 106a, 106b, 106c. The first, second, and third media presentation devices 104a, 104b, 104c and the first, second, and third set top boxes 106a, 106b, 106c obtain power via the respective first, second, and third outlets 108a, 108b, 108c. The first, second, and third media device meters 110a, 110b, 110c monitor media presented by the respective first, second, and third media presentation devices 104a, 104b, 104c, while the first, second, and third current sensors 112a, 112b, 112c determine current measurements associated with the first, second, and third media presentation devices 104a, 104b, 104c. The current data collected by the first, second, and third current sensors 112a, 112b, 112c and the meter data collected by the first, second, and third media device meters 110a, 110b, 110c are transmitted to the AME 114, where the current data and the meter data are received by the meter exception handler 116 for processing to identify correct and incorrect meter exceptions. The meter exception handler 116 generates meter exception assessment data based on the analysis of the current data and the meter data.

Figure 2:
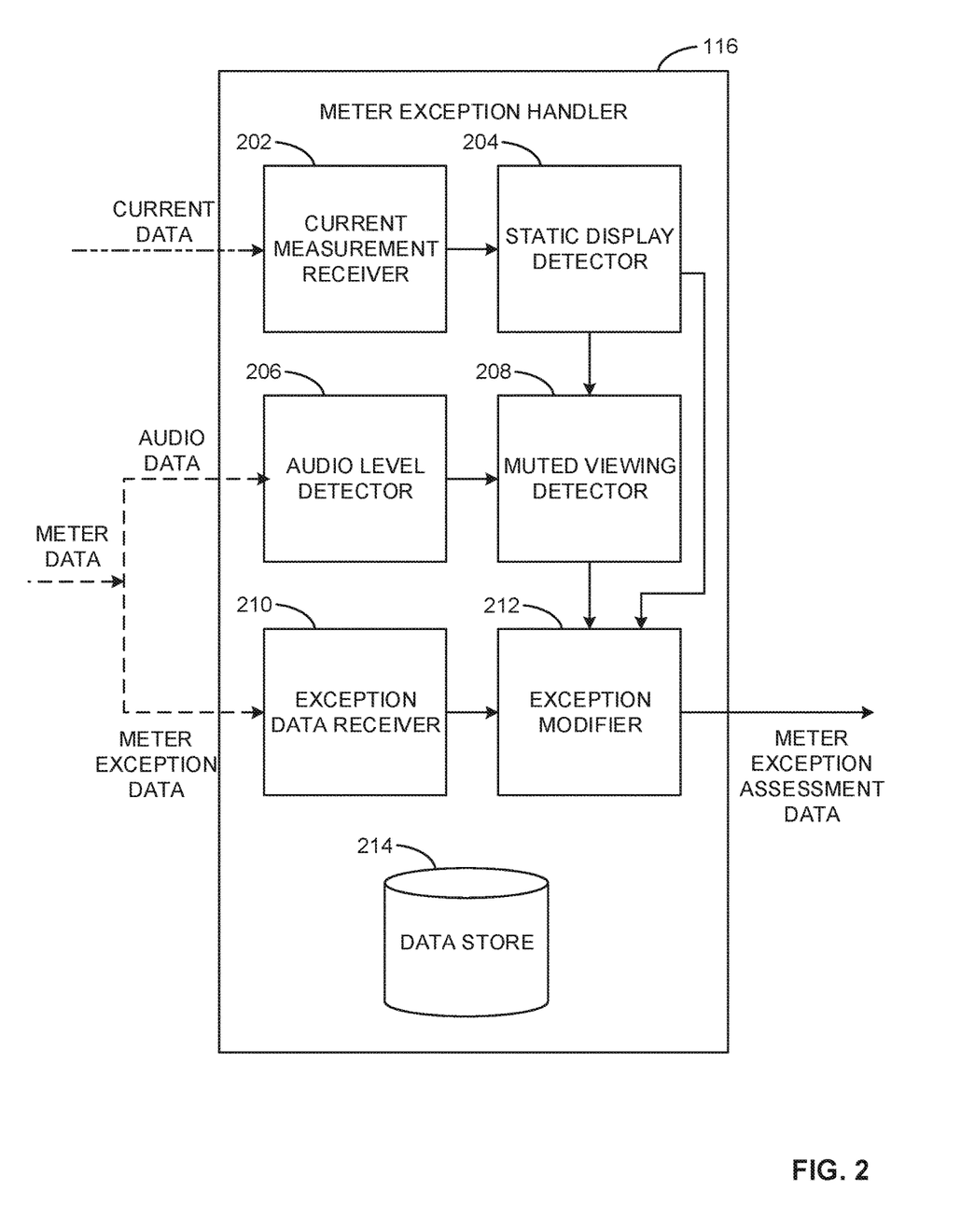
FIG. 2 is a block diagram of the example meter exception handler of FIG. 1 constructed in accordance with the teachings of this disclosure.

FIG. 2 is a block diagram of the example meter exception handler 116 of FIG. 1 constructed in accordance with the teachings of this disclosure. The example meter exception handler 116 includes an example current measurement receiver 202, an example static display detector 204, an example audio level detector 206, an example muted viewing detector 208, an example exception data receiver 210, an example exception modifier 212, and an example data store 214.

The example current measurement receiver 202 of the illustrated example of FIG. 2 accesses and/or receives current data. In some examples, the current measurement receiver 202 accesses current data corresponding to a specific current sensor (e.g., the first current sensor 112a) associated with a specific media device meter (e.g., the first media device meter 110a). In some examples, the current measurement receiver 202 only accesses a subset of the current data corresponding to a time of an exception (e.g., thirty seconds prior to the exception, thirty seconds after the exception, etc.). The current measurement receiver 202 can request the current data in response to the exception data receiver 210 accessing and/or receiving an exception or data indicative of an exception. In some examples, the current measurement receiver 202 accesses current data as the current data is transmitted from current sensors and/or media device meters. The current measurement receiver 202 can access current data and communicate the current data to the static display detector 204.

The example static display detector 204 of the illustrated example of FIG. 2 determines whether a media presentation device was in a static display state at a time of an exception. In some examples, the static display detector 204 receives current data for a time associated with an exception from the current measurement receiver 202. In some examples, the static display detector 204 requests current measurement data from the current measurement receiver 202 in response to the exception data receiver 210 identifying an exception and indicating a time associated with the exception to the static display detector 204. The static display detector 204 compares current measurements at the time of the exception with a threshold range associated with a static display. For example, if a television operates between 200 milliamperes (mA) and 250 mA when displaying a static screen, the static display detector 204 can compare current measurements at the time of the exception with this threshold range (e.g., 200 mA to 250 mA).

In some examples, the static display detector 204 also compares current measurements at the time of the exception with a deviation threshold to determine whether the current measurements deviate more than a static display would. For example, the static display detector 204 determines a deviation value associated with the current measurements for a duration threshold (e.g., five seconds surrounding the exception, two seconds surrounding the exception, etc.) and determines whether the current deviation meets or exceeds the threshold deviation to identify a static display state. In some examples, in response to (1) the current measurements at the time of the exception falling within the threshold range and (2) the current measurements having a deviation less than a threshold deviation for a duration threshold (e.g., a time surrounding the exception), the static display detector 204 can determine that the media presentation device associated with the exception was in a static display state at the time of the exception.

In some examples, after processing current data associated with an exception, the static display detector 204 informs the exception modifier 212 of whether the media presentation device associated with the exception was in a static display state at the time of the exception, thereby enabling the exception modifier 212 to determine whether the exception was correct or incorrect. In addition, in some examples, in response to determining the media presentation device associated with the exception was not in a static display state, the static display detector 204 informs the muted viewing detector 208 to determine whether the media presentation device was in a muted viewing state.

The example audio level detector 206 of the illustrated example of FIG. 2 accesses and/or receives audio data included in meter data from media device meters. For example, the audio level detector 206 can access audio data conveyed in the meter data from the first, second, and third media device meters 110a, 110b, 110c. In some examples, the audio data is transmitted to the meter exception handler 116 separately from the meter exception data. The audio level detector 206 determines volume levels associated with audio data. For example, the audio level detector 206 can sample audio data and store volume levels associated with the samples of the audio data, along with storing the times associated with the samples. Subsequently, the muted viewing detector 208 can utilize these volume levels to determine whether a media presentation device associated with an exception was in a muted viewing state at a time of the exception.

In some examples, the audio level detector 206 only determines volume levels associated with audio data captured at a time associated with an exception accessed by the exception data receiver 210. In other words, in some examples, the audio level detector 206 is triggered to operate when an exception has been identified. In some examples, the audio level detector 206 transmits audio data specific to a time associated with an exception to the muted viewing detector 208 in response to the exception data receiver 210 accessing an exception.

The example muted viewing detector 208 of the illustrated example of FIG. 2 determines whether a media presentation device was in a muted viewing state at a time of an exception. In some examples, to determine that the media presentation device was in the muted viewing state, the muted viewing detector 208 determines (1) that the media presentation device was not in a static display state at the time of the exception, and (2) that the audio data indicates the audio was below a volume threshold at the time of the exception. For example, the muted viewing detector 208 can access information from the static display detector 204 indicating whether or not an exception was associated with a static display state. Further, the muted viewing detector 208 can compare audio data at the time of the exception from the audio level detector 206 with a volume threshold. In some examples, when the muted viewing detector 208 determines that an exception is associated with a muted viewing state, the muted viewing detector 208 transmits an indication to the exception modifier 212 that the media presentation device associated with the exception was in a muted viewing state at the time of the exception.

The example exception data receiver 210 of the illustrated example of FIG. 2 accesses meter exception data from the media device meters 110a, 110b, 110c. In some examples, the exception data receiver 210 receives exceptions as the exceptions are encountered at the media device meter(s) 110a, 110b, 110c and transmitted to the exception data receiver 210 for processing. In some examples, the exception data receiver 210 receives exceptions from the media device meters 110a, 110b, 110c in batches (e.g., the media device meters 110a, 110b, 110c transmit exceptions to the exception data receiver 210 at regular intervals, the media device meters 110a, 110b, 110c transmit exceptions to the exception data receiver 210 when a threshold number of exceptions have been encountered, etc.). In some examples, the exception data receiver 210 communicates with the current measurement receiver 202, the static display detector 204, the audio level detector 206, and/or the muted viewing detector 208 to initiate analysis of current measurements and/or audio level data associated with a time of a received exception. The example exception data receiver 210 communicates exceptions and/or data associated with exceptions (e.g., times of the exceptions, exception types, etc.) to the exception modifier 212.

The example exception modifier 212 of the illustrated example of FIG. 2 analyzes exceptions and determines whether the exceptions are correct or incorrect. In some examples, when the exception modifier 212 accesses an exception, the exception modifier 212 can request data from the static display detector 204 and/or the muted viewing detector 208 pertaining to a time associated with the exception. In some examples, the exception modifier 212 designates (e.g., flags, labels) an exception as correct in response to the static display detector 204 indicating that a media presentation device associated with the exception was in a static display state at the time of the exception and/or in response to the muted viewing detector 208 indicating that the media presentation device associated with the exception was in a muted viewing state at the time of the exception. In response to determining that an exception is correct, the exception modifier 212 can indicate that the exception does not require troubleshooting (e.g., troubleshooting to correct an issue with a media device meter) by the AME 114.

In some examples, in response to the exception modifier 212 determining that a media presentation device associated with an exception was not in a static display state and not in a muted viewing state at a time associated with the exception, the exception modifier 212 designates (e.g., flags, labels, etc.) the exception as incorrect. In response to identifying an incorrect exception, the exception modifier 212 can initiate a troubleshooting process at the AME 114 to determine and/or address a cause of the incorrect exception. In some examples, the exception modifier 212 outputs meter exception assessment data indicating whether exceptions are correct or incorrect.

The example data store 214 is a storage location that can be used to store current data, audio data, meter exception data, and/or meter exception assessment data. The data store 214 can be implemented by a volatile memory (e.g., a Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory, etc.). The data store 214 can additionally or alternatively be implemented by one or more double data rate (DDR) memories, such as DDR, DDR2, DDR3, mobile DDR (mDDR), etc. The data store 214 can additionally or alternatively be implemented by one or more mass storage devices such as hard disk drive(s), compact disk drive(s) digital versatile disk drive(s), etc. While, in the illustrated example, the data store 214 is illustrated as a single database, the data store 214 can be implemented by any number and/or type(s) of databases. Furthermore, the data stored in the data store 214 can be in any data format such as, for example, binary data, comma delimited data, tab delimited data, structured query language (SQL) structures, etc.

In operation, the example current measurement receiver 202 accesses current data and communicates the current data to the static display detector 204. The static display detector 204 determines whether a media presentation device was in a static display state at a time of an exception based on whether the current data is within a threshold range and/or is constant within a deviation threshold for a duration threshold. The audio level detector 206 accesses audio data and communicates the audio data to the muted viewing detector 208 which determines whether a media presentation device was in a muted viewing state at a time of an exception. For example, the muted viewing detector 208 can determine the media presentation device was in the muted viewing state when the audio data indicates an audio level below a threshold. The example exception data receiver 210 accesses exceptions from media device meters and communicates the exceptions to the exception modifier 212. The exception modifier 212 designates the exceptions as being correct or incorrect based on information from the static display detector 204 and/or the muted viewing detector 208. The exception modifier 212 thereby generates meter exception assessment data, which can be stored, in addition or alternatively to the current data, audio data, and meter exception data, in the data store 214.

While an example manner of implementing the meter exception handler 116 of FIG. 1 is illustrated in FIG. 2, one or more of the elements, processes and/or devices illustrated in FIG. 2 may be combined, divided, re-arranged, omitted, eliminated, and/or implemented in any other way. For example, in some examples, the media exception handler 116 may be incorporated into a media device meter 110a, 110b, 110c where data is locally processed and results are transmitted to the AME 114. Further, the example media device meter 110a, 110b, 110c, the example current measurement receiver 202, the static display detector 204, the audio level detector 206, the example muted viewing detector 208, the example exception data receiver 210, the example exception modifier 212, the example data store 214 and/or, more generally, the example meter exception handler 116 of FIG. 2 may be implemented by hardware, software, firmware and/or any combination of hardware, software, and/or firmware. Thus, for example, any of the example media device meter 110a, 110b, 110c, the example current measurement receiver 202, the static display detector 204, the audio level detector 206, the example muted viewing detector 208, the example exception data receiver 210, the example exception modifier 212, the example data store 214 and/or, more generally, the example meter exception handler 116 of FIG. 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). When reading any of the apparatus or system claims of this patent to cover a purely software and/or firmware implementation, at least one of the example media device meter 110a, 110b, 110c, the example current measurement receiver 202, the static display detector 204, the audio level detector 206, the example muted viewing detector 208, the example exception data receiver 210, the example exception modifier 212, the example data store 214 and/or, more generally, the example meter exception handler 116 of FIG. 2 is/are hereby expressly defined to include a non-transitory computer readable storage device or storage disk such as a memory, a digital versatile disk (DVD), a compact disk (CD), a Blu-ray disk, etc. including the software and/or firmware. Further still, the example meter exception handler 116 of FIG. 2 may include one or more elements, processes, and/or devices in addition to, or instead of, those illustrated in FIG. 2, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
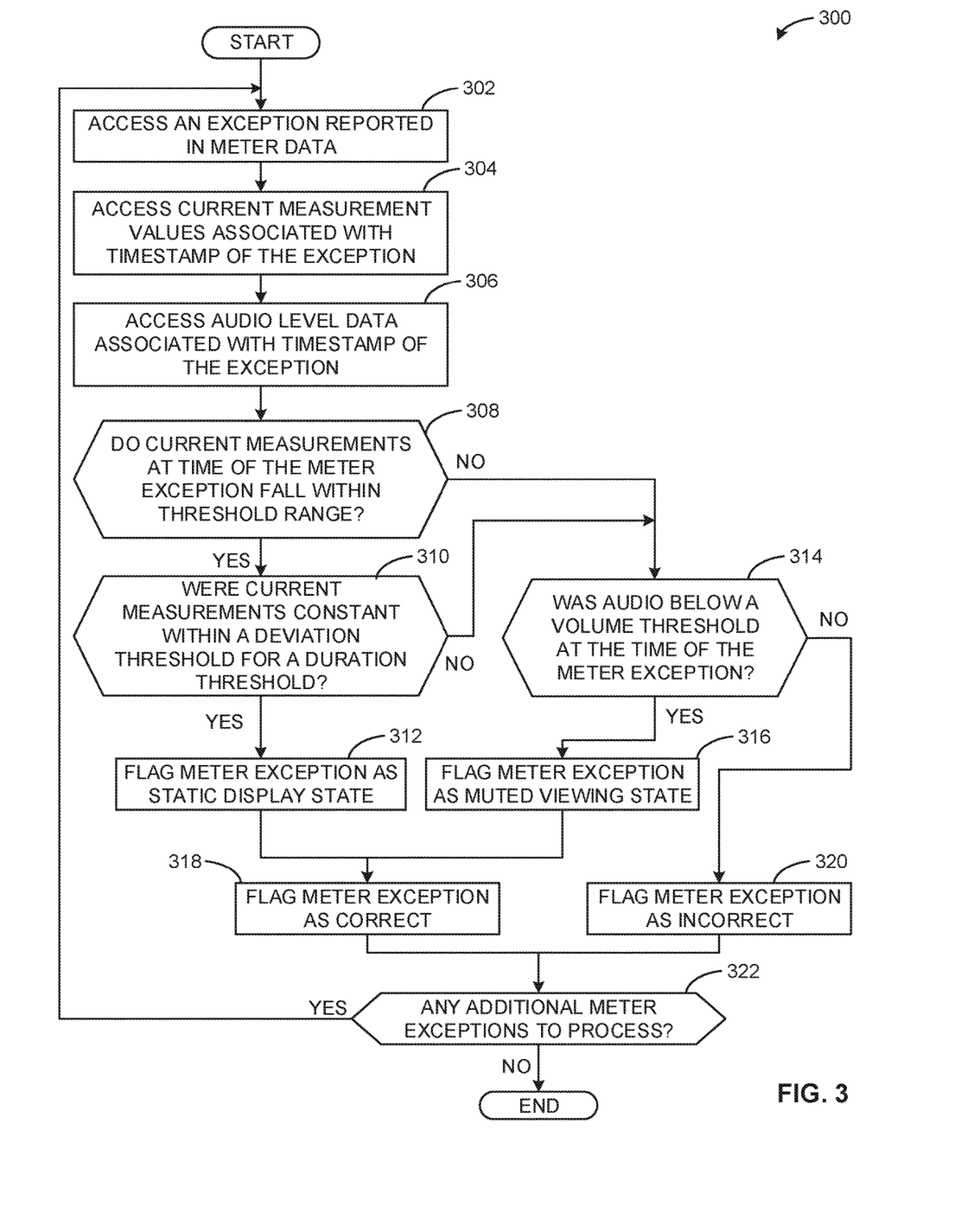
FIG. 3 is a flowchart representative of machine readable instructions which may be executed to implement the example meter exception handler of FIGS. 1 and 2.

A flowchart representative of example hardware logic, machine readable instructions, hardware implemented state machines, and/or any combination thereof for implementing the meter exception handler of FIG. 2 is shown in FIG. 3. The machine readable instructions may be an executable program or portion of an executable program for execution by a computer processor such as the processor 612 shown in the example processor platform 600 discussed below in connection with FIG. 6. The program may be embodied in software stored on a non-transitory computer readable storage medium such as a CD-ROM, a floppy disk, a hard drive, a DVD, a Blu-ray disk, or a memory associated with the processor 612, but the entire program and/or parts thereof could alternatively be executed by a device other than the processor 612 and/or embodied in firmware or dedicated hardware. Further, although the example program is described with reference to the flowchart illustrated in FIG. 3, many other methods of implementing the example meter exception handler 116 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIG. 3 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory, and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

Example machine readable instructions 300 that may be executed by the meter exception handler 116 are illustrated in FIG. 3. With reference to the preceding figures and associated descriptions, the example machine readable instructions 300 of FIG. 3 begin with the example meter exception handler 116 accessing an exception reported in meter data (block 302). For example, the exception data receiver 210 can access an exception reported in meter data by a media device meter (e.g., the first, second, and third media device meters 110a, 110b, 110c of FIG. 1).

At block 304, the example meter exception handler 116 accesses current measurement values associated with a timestamp of the exception. In some examples, the current measurement receiver 202 accesses current measurement values associated with a timestamp of the exception. In some examples, the static display detector 204, in response to the exception data receiver 210 accessing the exception, requests the current measurement values associated with the timestamp of the exception from the current measurement receiver 202. In some examples, the static display detector 204 accesses current measurement values for the media presentation device corresponding to the exception for a time range around the timestamp of the exception (e.g., five seconds before the timestamp and five seconds after the timestamp, ten seconds before the timestamp and ten seconds after the timestamp, and/or other suitable ranges).

At block 306, the example meter exception handler 116 accesses audio level data associated with the time stamp of the exception. In some examples, the audio level detector 206 accesses audio level data associated with the time stamp of the exception. In some examples, the audio level detector 206 continually accesses audio data from a plurality of media device meters (e.g., the first, second, and third media device meters 110a, 110b, 110c), while in some examples, the audio level detector 206 accesses audio data from media device meter(s) associated with exception(s) in response to the exception data receiver 210 accessing the exception(s) corresponding to the respective media device meter(s). In some examples, the audio level detector 206 accesses audio level data for a time range around the timestamp of the exception (e.g., five seconds before the timestamp and five seconds after the timestamp, ten seconds before the timestamp and ten seconds after the timestamp, and/or other suitable ranges).

At block 308, the example meter exception handler 116 determines whether the current measurements at the time of the meter exception fall within a threshold range. In some examples, the static display detector 204 compares current measurements associated with the media device meter at the time of the exception with a threshold range (e.g., a lower limit current value and an upper limit current value). For example, the static display detector 204 can determine whether current measurements for five seconds prior to the time of the timestamp and/or for five seconds after the time of the timestamp are within the threshold range. Example plots depicting current measurements being compared to an example threshold range are illustrated and described in connection with FIGS. 4A-4B. In response to the current measurements at the time of the meter exception falling within the threshold range, processing of the example instructions 300 transfers to block 312. Conversely, in response to current measurements at the time of the meter exception not falling within the threshold range, processing of the example instructions 300 transfers to block 314.

At block 310, the example meter exception handler 116 determines whether current measurements were constant within a deviation threshold for a duration threshold. For example, the static display detector 204 can determine whether, for a duration threshold (e.g., one second before and one second after the exception, five seconds before and five seconds after the exception, and/or other suitable ranges), the current measurements remained within a deviation threshold (e.g., a two percent deviation from the current value at the time of the meter exception, a 5 mA deviation from the current value at the time of the meter exception, and/or other suitable ranges of these and/or other suitable parameters). In some examples, the deviation threshold is measured relative to the current value at the time of the exception. In some examples, the deviation threshold is measured as a maximum change throughout the duration threshold (e.g., the minimum current value subtracted from the maximum current value from within the duration threshold). The deviation threshold is intended to determine whether the screen is truly static (non-changing), as the current measurements may, in some examples, satisfy the threshold range (e.g., associated with block 308), but actually be fluctuating within that range due to different television configurations (e.g., which may be presenting media, but utilizing lower amperage settings). Example plots depicting current measurement deviation values are illustrated and described in connection with FIGS. 4A-4B. In response to the current measurements being constant within the deviation threshold for the duration threshold, processing of the example instructions 300 transfers to block 312. Conversely, in response to determining that the current measurements were not constant within the deviation threshold for the duration threshold, processing of the example instructions 300 transfers to block 314.

At block 312, the example meter exception handler 116 flags the meter exception as corresponding to a static display state. In some examples, the exception modifier 212 flags (e.g., labels, tags, designates, etc.) the meter exception as corresponding to the static display state.

At block 314, the example meter exception handler 116 determines whether the audio was below a volume threshold at the time of the meter exception. In some examples, the muted viewing detector 208 determines whether the audio was below a volume threshold at the time of the meter exception. In some examples, the volume threshold is configured to be set at a level higher than would be generated by ambient noise (e.g., heating, ventilation, and air conditioning (HVAC) noises, persons walking around, quiet speaking, etc.) but lower than would be generated by quiet media on the media presentation device. In some examples, if the audio data is collected directly from the media presentation device as opposed to recorded via a microphone, the volume threshold can be configured to be very low, as a muted program should have no volume output. In response to determining that the audio was below a volume threshold at the time of the meter exception, processing of the example instructions 300 transfers to block 316. Conversely, in response to determining that the audio was not below the volume threshold at the time of the meter exception, processing of the example instructions 300 transfers to block 320.

At block 316, the example meter exception handler 116 flags the meter exception as corresponding to a muted viewing state. In some examples, the exception modifier 212 flags (e.g., labels, tags, designates, etc.) the meter exception as corresponding to the muted viewing state.

At block 318, the example meter exception handler 116 flags the meter exception as correct. In some examples, the exception modifier 212 flags the meter exception as correct, thereby generating meter exception assessment data. In addition, at block 320, the example meter exception handler 116 flags the meter exception as incorrect. In some examples, the exception modifier 212 flags the meter exception as correct, thereby generating meter exception assessment data. In some examples, the meter exception handler 116 can choose to not flag either correct exceptions, or incorrect exceptions, and only flag one type (e.g., only flag "incorrect" exceptions), implying that all non-flagged exceptions are the opposite. For example, if the meter exception handler 116 only flags incorrect exceptions, any meter exception that is not flagged can be considered correct.

At block 322, the example meter exception handler 116 determines whether there are any additional meter exceptions to process. In some examples, the exception data receiver 210 determines whether there are any additional meter exceptions to process. In response to there being additional meter exceptions to process, processing of the example instructions 300 transfers to block 302. Conversely, in response to there not being additional meter exceptions to process, processing terminates.

Figure 4A:
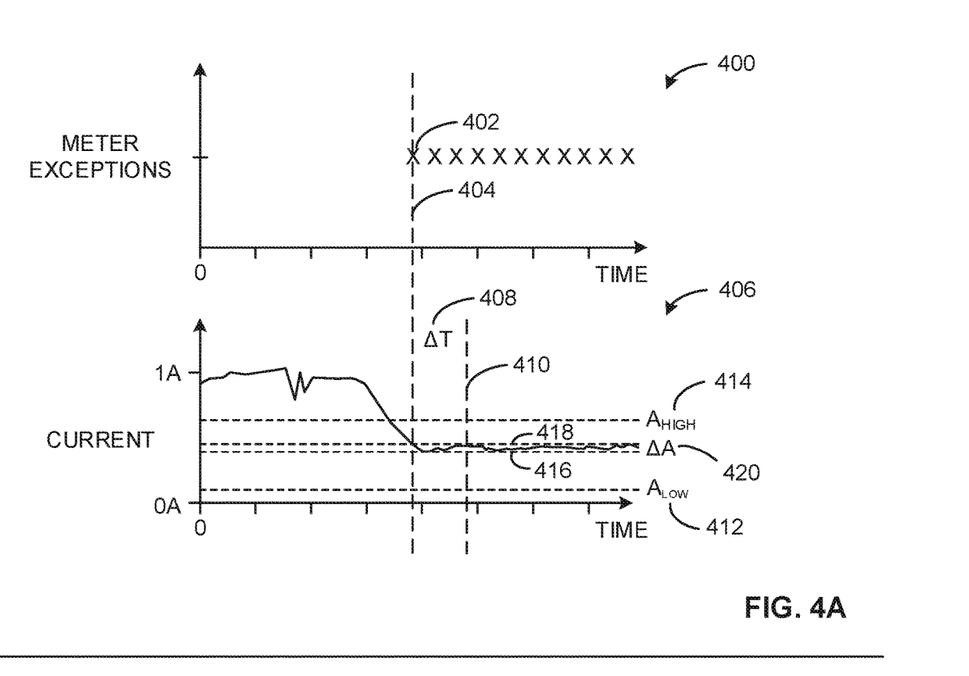
FIGS. 4A-4B are example plots of meter exceptions and current data that can be analyzed by the meter exception handler of FIGS. 1 and 2 to handle meter exceptions.
Figure 4B:
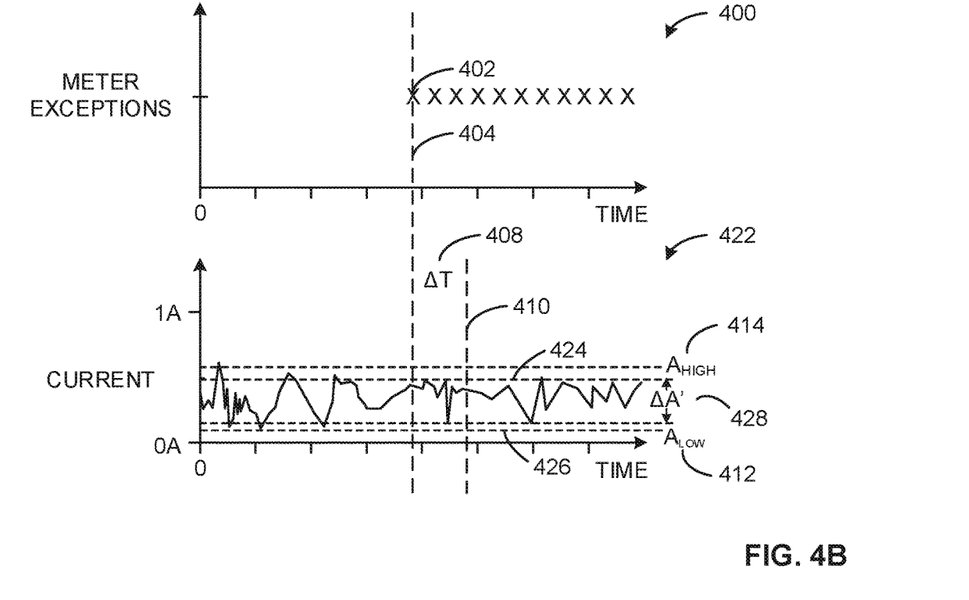

FIGS. 4A-4B are plots of meter exceptions and current data that can be analyzed by the meter exception handler 116 to handle meter exceptions. FIG. 4A includes an example meter exception plot 400, and an example first current plot 406. The example meter exception plot 400 includes an example meter exception 402 corresponding to an example meter exception time 404. The example first current plot 406 includes an example duration threshold 408 ($\Delta T$), an example duration threshold end time 410, an example lower current threshold 412 ($A_{LOW}$), an example upper current threshold 414 ($A_{HIGH}$), an example first minimum current value 416, an example first maximum current value 418, and an example first current deviation 420 ($\Delta A$).

The example meter exception plot 400 includes a time axis extending to the right from a zero time value, and a discrete meter exceptions line, where meter exceptions that are encountered are indicated by "X" symbols. The example meter exception 402 corresponds to a meter exception recorded at a media device meter (e.g., one of the first, second, and third media device meters 110a, 110b, 110c). The meter exception 402 is stored and/or transmitted to the meter exception handler 116 with the meter exception time 404, which designates the time at which the meter exception 402 occurred. The meter exception plot 400 includes a plurality of exceptions that occur in succession with the first meter exception 402. For brevity, the meter exception 402 is the only meter exception that is analyzed and discussed, but the same analysis can be performed on other ones of the plurality of meter exceptions.

The example first current plot 406 includes a time axis as the x-axis extending to the right from a zero time value, and a current axis as the y-axis representing current values in amperes, extending upward from a zero ampere value. When analyzing current measurements to determine if a media presentation device was in a static display state, the meter exception handler 116 can analyze a duration threshold beginning at the meter exception time 404 and extending to the duration threshold end time 410. The duration threshold 408 could be any time value extending prior to the meter exception time 404 and/or after the meter exception time 404. For simplicity, for the current plots displayed in FIGS. 4A-4B and FIGS. 5A-5B, the duration threshold is represented as a brief time period beginning at the meter exception time 404 and extending for several seconds (e.g., until the duration threshold end time 410).

As described in block 308 of the flowchart of FIG. 3, the meter exception handler 116 determines whether current measurements associated with a meter exception fall within a threshold range. The first current plot 406 includes the lower current threshold 412 and the upper current threshold 414. These thresholds represent a range of current values that a media presentation device having a static display would be predicted to exhibit. For example, some media presentation devices may present a static display with a relatively higher current value relative to other media presentation devices. Similarly, some types of static displays (e.g., different colors, patterns, etc.) may correspond to higher current values than other types of displays. The meter exception handler 116 determines whether current measurements during the duration threshold 408 fall within the threshold range (e.g., are higher than the lower current threshold 412, and lower than the upper current threshold 414). In the first current plot 406, the values are within this range during the time period of the duration threshold 408. In some examples, the meter exception handler 116 analyzes a current value at the meter exception time 404 to determine whether the current value falls within the threshold range, without analyzing current measurements for the full duration threshold 408.

As described in block 312 of the flowchart of FIG. 3, the meter exception handler 116 determines whether current measurements were constant within a deviation threshold for a duration threshold. The first current plot 406 includes the first minimum current value 416 and the first maximum current value 418, representing respective minimum and maximum current values observed during the duration threshold 408. The difference between the first maximum current value 418 and the first minimum current value 416 is represented as the first current deviation 420. In some examples, the current deviation can be represented as a percent change from a current value at the meter exception time 404, as a standard deviation value, or any other means of quantifying the amount of variance in the current measurements during the duration threshold 408. The example first current deviation 420 can be compared to a deviation threshold to determine whether the media presentation device associated with an exception was in a static display state at the time of the exception. As the first current deviation 420 is relatively small, and the current measurements are relatively constant during the duration threshold 408, the meter exception handler 116 may determine that the current deviation 420 is less than the deviation threshold and that the media presentation device was in a static display state at the time of the exception 402. If the meter exception handler 116 determined that the media presentation device was in the static display state, the meter exception 402 is labeled as correct (e.g., the media device meter associated with the exception encountered the exception because the media presentation device was not presenting perceptible media).

FIG. 4B includes the meter exception plot 400, with a second current plot 422, representing different possible current measurements. The second current plot 422 includes the lower current threshold 412 ($A_{LOW}$) and the upper current threshold 414 ($A_{HIGH}$). As in FIG. 4B, the current measurements during the duration threshold 408 ($\Delta T$) fall within the threshold range (e.g., are above the lower current threshold 412 but below the upper current threshold 414). However, the current measurements during the duration threshold 408 include an example second maximum current value 424, representing the maximum current value observed during the duration threshold 408, and an example second minimum current value 426, representing the minimum current value observed during the duration threshold 408. An example second current deviation 428 ($\Delta A'$) represents the difference between the second maximum current value 424 and the second minimum current value 426. The second current deviation 428 is larger than the first current deviation 420. In some examples, when the meter exception handler 116 compares the second current deviation to the deviation threshold, the meter exception 402 associated with the second current plot 422 may not satisfy the deviation threshold for the duration threshold 408, thus resulting in the meter exception handler 116 determining that the media presentation device associated with the meter exception 402 was not in a static display state at the time of the meter exception 402. The example second current plot 422 may be associated with a media presentation device that operates at lower current values, as the current measurements throughout the plot remain mostly within the threshold range, but have high deviation, which is not characteristic of a static display state.

Figure 5A:
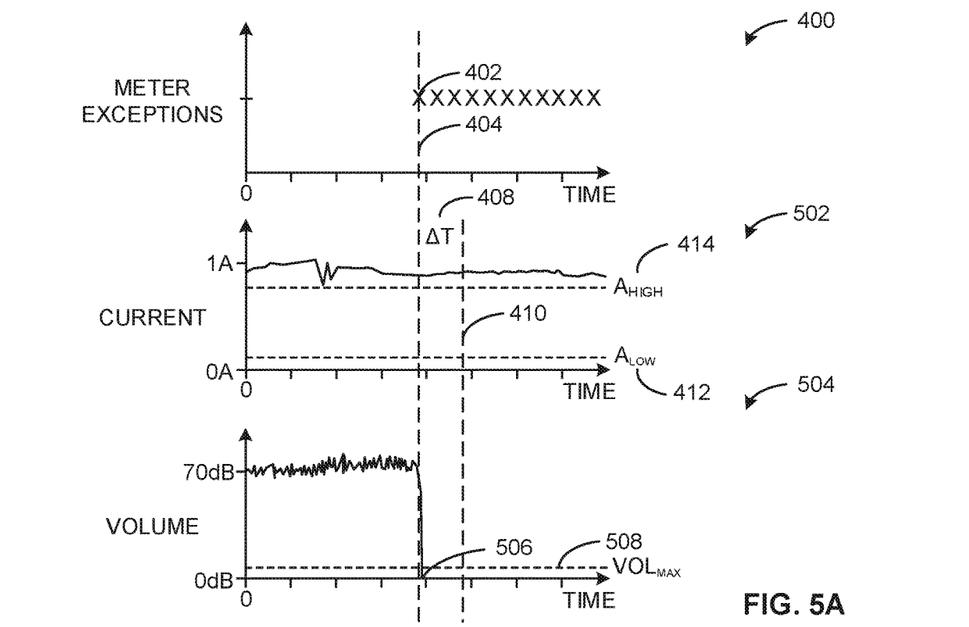
FIGS. 5A-5B are example plots of meter exceptions, current data, and volume data that can be analyzed by the meter exception handler of FIGS. 1 and 2 to handle meter exceptions.
Figure 5B:
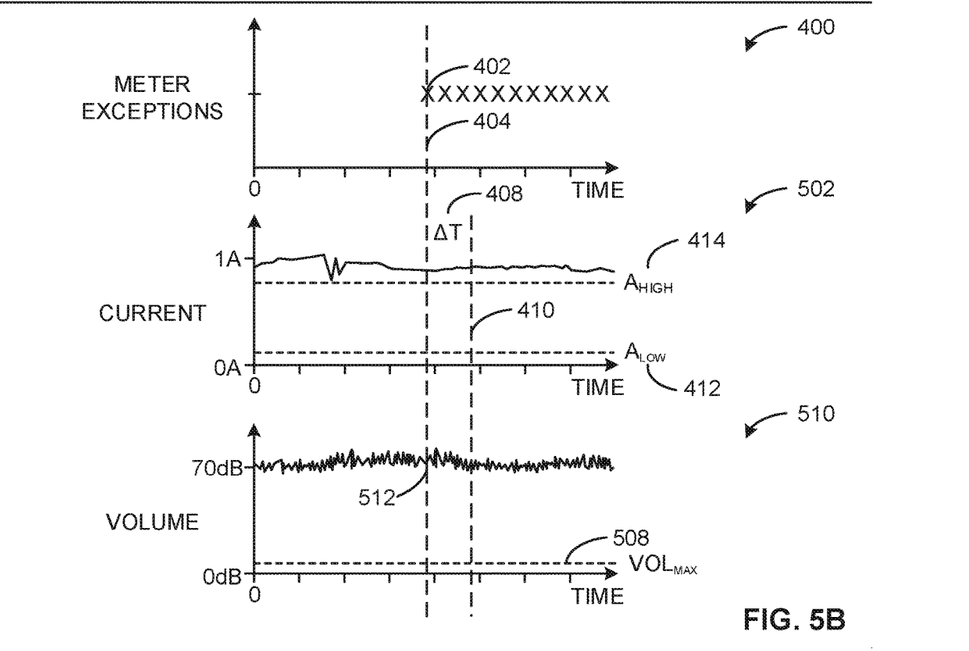

FIGS. 5A-5B are plots of meter exceptions, current data, and volume data that can be analyzed by the meter exception handler 116 to handle meter exceptions. FIG. 5A includes the meter exception plot 400, as well as an example third current plot 502, and an example first volume plot 504. While FIG. 4A includes the same meter exception plot 400, the example third current plot 502 and the first volume plot 504 represent different possible analysis outcomes corresponding to different current data and utilizing volume data to determine whether a media presentation device was in a muted viewing state.

The example third current plot 502 depicts current measurement data corresponding to times around the meter exception time 404. The third current plot 502 includes the lower current threshold 412 ($A_{LOW}$) and the upper current threshold 414 ($A_{HIGH}$). The current measurements during the duration threshold 408 ($\Delta T$) exceed the upper current threshold 414. As a result, based on this example data, the meter exception handler 116 determines that the media presentation device associated with the meter exception 402 was not in a static display state at the meter exception time 404.

The example first volume plot 504 depicts volume data around the meter exception time 404. The first volume plot 504 includes an example first volume level 506 associated with the volume measurement at the meter exception time 404. The first volume plot 504 also includes an example volume threshold 508 ($VOL_{MAX}$) representing a maximum volume level that can be associated with a media presentation device in a muted viewing state. In the first volume plot 504, the first volume level 506, associated with the meter exception time 404, is below the volume threshold 508. In some examples, the meter exception handler 116 determines the media presentation device associated with the exception 402 is in a muted viewing state based on the first volume level 506 being below the volume threshold 508 and based on the media presentation device not being in a static display state. In some examples, the meter exception handler 116 additionally or alternatively analyzes volume levels throughout the duration threshold 408 to determine if the volume remains below the volume threshold 508 for the entire duration threshold 408. Based on the volume data associated with the first volume plot 504, the first volume level 506, as well as all volume levels in the duration threshold 408, remain below the volume threshold 508. Therefore, based on the third current plot 502 indicating that the media presentation device associated with the exception 402 is not in a static display state, and the volume levels remaining below the volume threshold 508, the meter exception handler 116 determines that the meter exception 402 is associated with a muted viewing state.

FIG. 5B includes the meter exception plot 400, the third current plot 502, and an example second volume plot 510. The volume data represented by the second volume plot 510 indicates another example meter exception analysis outcome. The second volume plot 510 includes an example second volume level 512 that is above the volume threshold 508. Therefore, the meter exception handler 116, performing analysis on the data represented in FIG. 5B, may determine that the media presentation device associated with the meter exception 402 does not correspond to a muted viewing state, based on the second volume level 512 being above the volume threshold 508 and the current measurements being outside the threshold range associated with the lower current threshold 412 and the upper current threshold 414.

Figure 6:
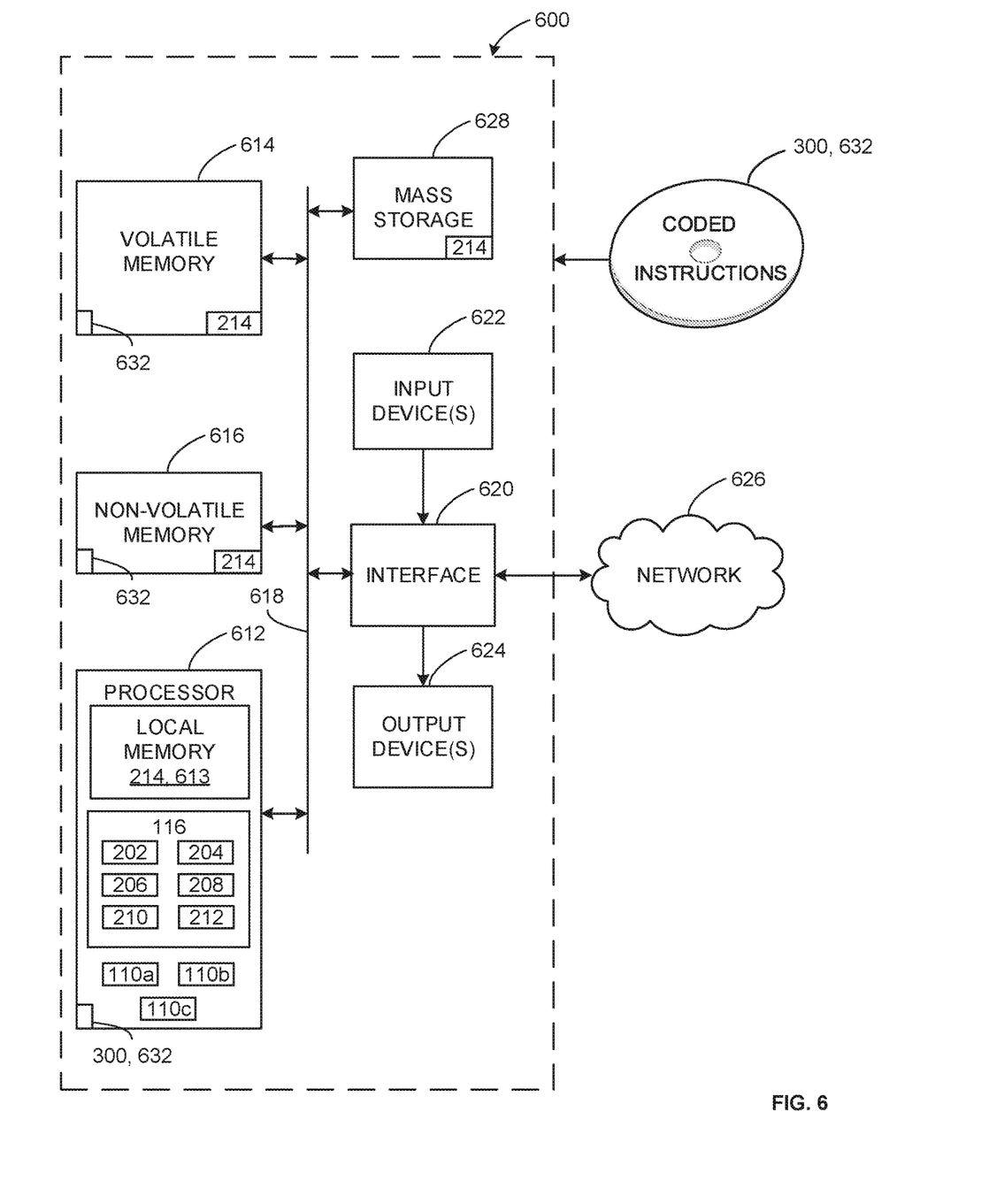
FIG. 6 is a block diagram of an example processing platform structured to execute the instructions of FIG. 3 to implement the example meter exception handler of FIGS. 1 and 2.

FIG. 6 is a block diagram of an example processor platform 1000 structured to execute the instructions of FIG. 3 to implement the meter exception handler 116 of FIGS. 1 and 2. The processor platform 600 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 600 of the illustrated example includes a processor 612. The processor 612 of the illustrated example is hardware. For example, the processor 612 can be implemented by one or more integrated circuits, logic circuits, microprocessors, GPUs, DSPs, or controllers from any desired family or manufacturer. The hardware processor may be a semiconductor based (e.g., silicon based) device. In this example, the processor 612 implements the example media device meters 110a, 110b, 100c, the example current measurement receiver 202, the static display detector 204, the audio level detector 206, the example muted viewing detector 208, the example exception data receiver 210, the example exception modifier 212, and/or, more generally, the example meter exception handler 116 of FIGS. 1 and 2.

The processor 612 of the illustrated example includes a local memory 613, 214 (e.g., a cache). The processor 612 of the illustrated example is in communication with a main memory including a volatile memory 614 and a non-volatile memory 616 via a bus 618. The volatile memory 614 may be implemented by Synchronous Dynamic Random Access Memory (SDRAM), Dynamic Random Access Memory (DRAM), RAMBUS® Dynamic Random Access Memory (RDRAM®), and/or any other type of random access memory device. The non-volatile memory 616 may be implemented by flash memory and/or any other desired type of memory device. Access to the main memory 614, 616 is controlled by a memory controller.

The processor platform 600 of the illustrated example also includes an interface circuit 620. The interface circuit 620 may be implemented by any type of interface standard, such as an Ethernet interface, a universal serial bus (USB), a Bluetooth® interface, a near field communication (NFC) interface, and/or a PCI express interface.

In the illustrated example, one or more input devices 622 are connected to the interface circuit 620. The input device(s) 622 permit(s) a user to enter data and/or commands into the processor 612. The input device(s) can be implemented by, for example, an audio sensor, a microphone, a camera (still or video), a keyboard, a button, a mouse, a touchscreen, a track-pad, a trackball, isopoint, and/or a voice recognition system.

One or more output devices 624 are also connected to the interface circuit 620 of the illustrated example. The output devices 624 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer, and/or speaker. The interface circuit 620 of the illustrated example, thus, typically includes a graphics driver card, a graphics driver chip, and/or a graphics driver processor.

The interface circuit 620 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 626. The communication can be via, for example, an Ethernet connection, a digital subscriber line (DSL) connection, a telephone line connection, a coaxial cable system, a satellite system, a line-of-site wireless system, a cellular telephone system, etc.

The processor platform 600 of the illustrated example also includes one or more mass storage devices 628 for storing software and/or data. Examples of such mass storage devices 628 include floppy disk drives, hard drive disks, compact disk drives, Blu-ray disk drives, redundant array of independent disks (RAID) systems, and digital versatile disk (DVD) drives.

The machine executable instructions 300 of FIG. 3 and/or other machine executable instructions 632 may be stored in the mass storage device 628, in the volatile memory 614, in the non-volatile memory 616, and/or on a removable non-transitory computer readable storage medium such as a CD or DVD.

From the foregoing, it will be appreciated that example apparatus, systems, articles of manufacture, and methods have been disclosed that enable analysis of exceptions issued by media device meters to determine whether the exceptions correspond to states where media is not perceptible or may correspond to problems with the media device meters. The example disclosed herein enable an AME to remotely determine whether a media presentation device associated with a meter exception was in a static display state, a muted viewing state, or neither of these states. Further, the AME can determine whether the meter exception is correct (e.g., associated with non-perceptible media) or incorrect (e.g., indicative of a problem with a media device meter). In enabling more accurate analysis of meter exceptions, and specific determination of incorrect meter exceptions, an AME can reduce an amount of resources expended (e.g., a number of visits to households, an amount of time spent troubleshooting, etc.) on debugging meter exceptions. The disclosed apparatus, systems, articles of manufacture, and methods improve the efficiency of using a computing device by enabling more granular and useful analysis of meter exceptions from a location remote from the meter. The disclosed apparatus, systems, articles of manufacture, and methods are accordingly directed to one or more improvement(s) in the functioning of a computer. An example media meter exception handling apparatus disclosed herein includes a static display detector to determine whether current measurements for a media presentation device at a time corresponding to an exception reported by a media device meter indicate the media presentation device was in a static display state at the time corresponding to the exception, a muted viewing detector to determine whether the media presentation device was in a muted viewing state at the time of the exception based on an audio level associated with the media presentation device at the time of the exception and whether the media presentation device was in the static display state at the time of the exception, and an exception modifier to determine whether to modify the exception based on whether the media presentation device was in the static display state and whether the media presentation device was in a muted viewing state at the time of the exception.

In some examples, the static display detector is to determine the current measurements indicate the media presentation device was in the static display state when the current measurements fall within a threshold range.

In some examples, the static display detector is to determine the current measurements indicate the media presentation device was in the static display when the current measurements deviate less than a deviation threshold for a duration threshold.

In some examples, the exception modifier is to flag the exception as correct in response to the media presentation device being in the static display state at the time of the exception.

In some examples, the exception modifier is to flag the exception as correct in response to the media presentation device being in the muted viewing state at the time of the exception.

In some examples, the exception modifier is to flag the exception as incorrect in response to the media presentation device not being in the static display state at the time of the exception and not being in the muted viewing state at the time of the exception.

In some examples, the audio level is received from the media device meter.

In some examples, the current measurements are received from at least one of the media device meter or a sensor that is to monitor current drawn by the media presentation device from an outlet.

Also disclosed herein is an example non-transitory computer readable storage medium that includes computer readable instructions that, when executed, cause a processor to at least determine whether current measurements for a media presentation device at a time corresponding to an exception reported by a media device meter indicate the media presentation device was in a static display state at the time corresponding to the exception, determine whether the media presentation device was in a muted viewing state at the time of the exception based on an audio level associated with the media presentation device at the time of the exception and whether the media presentation device was in the static display state at the time of the exception, and determine whether to modify the exception based on whether the media presentation device was in the static display state and whether the media presentation device was in a muted viewing state at the time of the exception.

In some examples, to determine the current measurements indicate the media presentation device was in the static display state, the computer readable instructions cause the processor to determine the current measurements fall within a threshold range.

In some examples, to determine the current measurements indicate the media presentation device was in the static display state, the computer readable instructions cause the processor to determine the current measurements deviate less than a deviation threshold for a duration threshold.

In some examples, the computer readable instructions cause the processor to flag the exception as correct in response to the media presentation device being in the static display state at the time of the exception.

In some examples, the computer readable instructions cause the processor to flag the exception as correct in response to the media presentation device being in the muted viewing state at the time of the exception.

In some examples, the computer readable instructions cause the processor to flag the exception as incorrect in response to the media presentation device not being in the static display state at the time of the exception and not being in the muted viewing state at the time of the exception.

Also disclosed herein is a method for handling exceptions reported by a media device meter. The example method includes determining, by executing instructions with a processor, whether current measurements for a media presentation device at a time corresponding to an exception reported by a media device meter indicate the media presentation device was in a static display state at the time corresponding to the exception, determining, by executing instructions with a processor, whether the media presentation device was in a muted viewing state at the time of the exception based on an audio level associated with the media presentation device at the time of the exception and whether the media presentation device was in the static display state at the time of the exception, and determining, by executing instructions with a processor, whether to modify the exception based on whether the media presentation device was in the static display state and whether the media presentation device was in a muted viewing state at the time of the exception.

In some examples, determining the current measurements indicate the media presentation device was in the static display state includes determining the current measurements fall within a threshold range.

In some examples, determining the current measurements indicate the media presentation device was in the static display state includes determining the current measurements deviate less than a deviation threshold for a duration threshold.

In some examples, the method further includes flagging, by executing instructions with a processor, the exception as correct in response to the media presentation device being in the static display state at the time of the exception.

In some examples, the method further includes flagging, by executing instructions with a processor, the exception as correct in response to the media presentation device being in the muted viewing state at the time of the exception.

In some examples, the method further includes flagging, by executing instructions with a processor, the exception as incorrect in response to the media presentation device not being in the static display state at the time of the exception and not being in the muted viewing state at the time of the exception.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A media meter exception handling apparatus comprising:
   a static display detector to determine whether current measurements for a media presentation device at a time corresponding to an exception reported by a media device meter indicate the media presentation device was in a static display state at the time corresponding to the exception, the static display detector to determine the media presentation device was in the static display state when the current measurements deviate from a first current value by less than a deviation threshold for a duration threshold, the first current value corresponding to the time of the exception, the deviation threshold determined based on a percentage of the first current value;
   a muted viewing detector to determine whether the media presentation device was in a muted viewing state at the time of the exception based on an audio level associated with the media presentation device at the time of the exception and whether the media presentation device was in the static display state at the time of the exception; and
   an exception modifier to determine whether to modify the exception based on whether the media presentation device was in the static display state and whether the media presentation device was in a muted viewing state at the time of the exception.

2. The apparatus of claim 1, wherein the exception modifier is to flag the exception as correct in response to the media presentation device being in the static display state at the time of the exception.

3. The apparatus of claim 1, wherein the exception modifier is to flag the exception as correct in response to the media presentation device being in the muted viewing state at the time of the exception.

4. The apparatus of claim 1, wherein the exception modifier is to flag the exception as incorrect in response to the media presentation device not being in the static display state at the time of the exception and not being in the muted viewing state at the time of the exception.

5. The apparatus of claim 1, wherein the audio level is received from the media device meter.

6. The apparatus of claim 1, wherein the current measurements are received from at least one of the media device meter or a sensor that is to monitor current drawn by the media presentation device from an outlet.

7. A non-transitory computer readable storage medium comprising computer readable instructions that, when executed, cause a processor to at least:
   determine whether current measurements for a media presentation device at a time corresponding to an exception reported by a media device meter indicate the media presentation device was in a static display state at the time corresponding to the exception, the instructions to cause the processor to determine the media presentation device was in the static display state when the current measurements deviate from a first current value by less than a deviation threshold for a duration threshold, the first current value corresponding to the time of the exception, the deviation threshold determined based on a percentage of the first current value;
   determine whether the media presentation device was in a muted viewing state at the time of the exception based on an audio level associated with the media presentation device at the time of the exception and whether the media presentation device was in the static display state at the time of the exception; and
   determine whether to modify the exception based on whether the media presentation device was in the static display state and whether the media presentation device was in a muted viewing state at the time of the exception.

8. The non-transitory computer readable storage medium of claim 7, wherein the computer readable instructions cause the processor to flag the exception as correct in response to the media presentation device being in the static display state at the time of the exception.

9. The non-transitory computer readable storage medium of claim 7, wherein the computer readable instructions cause the processor to flag the exception as correct in response to the media presentation device being in the muted viewing state at the time of the exception.

10. The non-transitory computer readable storage medium of claim 7, wherein the computer readable instructions cause the processor to flag the exception as incorrect in response to the media presentation device not being in the static display state at the time of the exception and not being in the muted viewing state at the time of the exception.

11. A method for handling exceptions reported by a media device meter, the method comprising:
  determining, by executing instructions with a processor, whether current measurements for a media presentation device at a time corresponding to an exception reported by a media device meter indicate the media presentation device was in a static display state at the time corresponding to the exception, the current measurements indicating the media presentation device was in the static display state when the current measurements deviate from a first current value by less than a deviation threshold for a duration threshold, the first current value corresponding to the time of the exception, the deviation threshold determined based on a percentage of the first current value;
  determining, by executing instructions with a processor, whether the media presentation device was in a muted viewing state at the time of the exception based on an audio level associated with the media presentation device at the time of the exception and whether the media presentation device was in the static display state at the time of the exception; and
  determining, by executing instructions with a processor, whether to modify the exception based on whether the media presentation device was in the static display state and whether the media presentation device was in a muted viewing state at the time of the exception.

12. The method of claim 11, further including flagging, by executing instructions with a processor, the exception as correct in response to the media presentation device being in the static display state at the time of the exception.

13. The method of claim 11, further including flagging, by executing instructions with a processor, the exception as correct in response to the media presentation device being in the muted viewing state at the time of the exception.

14. The method of claim 11, further including flagging, by executing instructions with a processor, the exception as incorrect in response to the media presentation device not being in the static display state at the time of the exception and not being in the muted viewing state at the time of the exception.

* * * * *